(12) United States Patent
Yamashita

(10) Patent No.: US 7,948,295 B2
(45) Date of Patent: May 24, 2011

(54) MINIATURIZED DEMULTIPLEXER AND ELECTRONIC DEVICE USING SAME

(75) Inventor: Keitaro Yamashita, Hyogo (JP)

(73) Assignee: Chimei Innolux Corporation, Chu-Nan (TW)

( * ) Notice: Subject to any disclaimer, the term of this patent is extended or adjusted under 35 U.S.C. 154(b) by 41 days.

(21) Appl. No.: 12/404,112

(22) Filed: Mar. 13, 2009

(65) Prior Publication Data

US 2009/0273388 A1    Nov. 5, 2009

(30) Foreign Application Priority Data

Mar. 13, 2008    (JP) .................................. 2008-064407

(51) Int. Cl.
 *H03K 17/00*    (2006.01)
(52) U.S. Cl. ........ 327/415; 327/416; 327/417; 370/542; 370/543; 370/544
(58) Field of Classification Search .......... 327/415–417; 370/542–544
See application file for complete search history.

(56) References Cited

U.S. PATENT DOCUMENTS

| | | | | |
|---|---|---|---|---|
| 4,725,742 A | * | 2/1988 | Tachimori et al. | 326/106 |
| 4,813,041 A | * | 3/1989 | Reyneri | 370/532 |
| 6,882,211 B2 | * | 4/2005 | Kozaki | 327/407 |

FOREIGN PATENT DOCUMENTS

| | | |
|---|---|---|
| JP | 2007-334109 | 12/2007 |
| WO | 97/39528 | 10/1997 |

* cited by examiner

*Primary Examiner* — Kenneth B. Wells
(74) *Attorney, Agent, or Firm* — Liu & Liu (57) ABSTRACT

A demultiplexer includes an input terminal for providing an input signal, a plurality of output terminals for outputting the input signal, and a switching circuit coupled among the input terminal and the plurality of output terminals, and outputting the input signal selectively from the plurality of output terminals according to a plurality of control signals provided to a plurality of control terminals. For miniaturizing the demultiplexer, the switching circuit includes one or more switch elements connected between the input terminal and each of the output terminals in series, wherein at least two of the switch elements coupled to different output terminals are simultaneously switched in response to one control signal from the plurality of control terminals.

20 Claims, 10 Drawing Sheets

MINIATURIZED DEMULTIPLEXER AND ELECTRONIC DEVICE USING SAME

FIELD OF THE INVENTION

The present invention relates to a demultiplexer, and more particularly to a demultiplexer which selects a data output by way of time division. The present invention also relates to an electronic device such as a liquid crystal display using a demultiplexer.

BACKGROUND OF THE INVENTION

Nowadays, with the increasing demand on high resolution of LCD, there is a trend towards narrowing the frame of a display panel.

Generally, the analog voltage applied to an internal pixel for revealing contents to be displayed is provided by a source driver IC with an external image data input interface, which is disposed in the frame area on the glass substrate. The source driver IC includes a plurality of output terminals which are connected to the pixel array by way of, for example, metal-thin-film wiring on the glass substrate.

Typically, the number of wires extending from a side of the pixel array conforms to the number of pixels in a row. However, the number of output terminals of the source driver IC arranged in parallel is less than the number of pixels in a row due to the size of the output terminals.

Accordingly, a demultiplexer operating by time division is used, as disclosed in Japanese Laid Open Patent Publication No. 2007-334109, to distribute a less number of terminals of the source driver IC to a greater number of wires at a side of the array.

Figure 9:
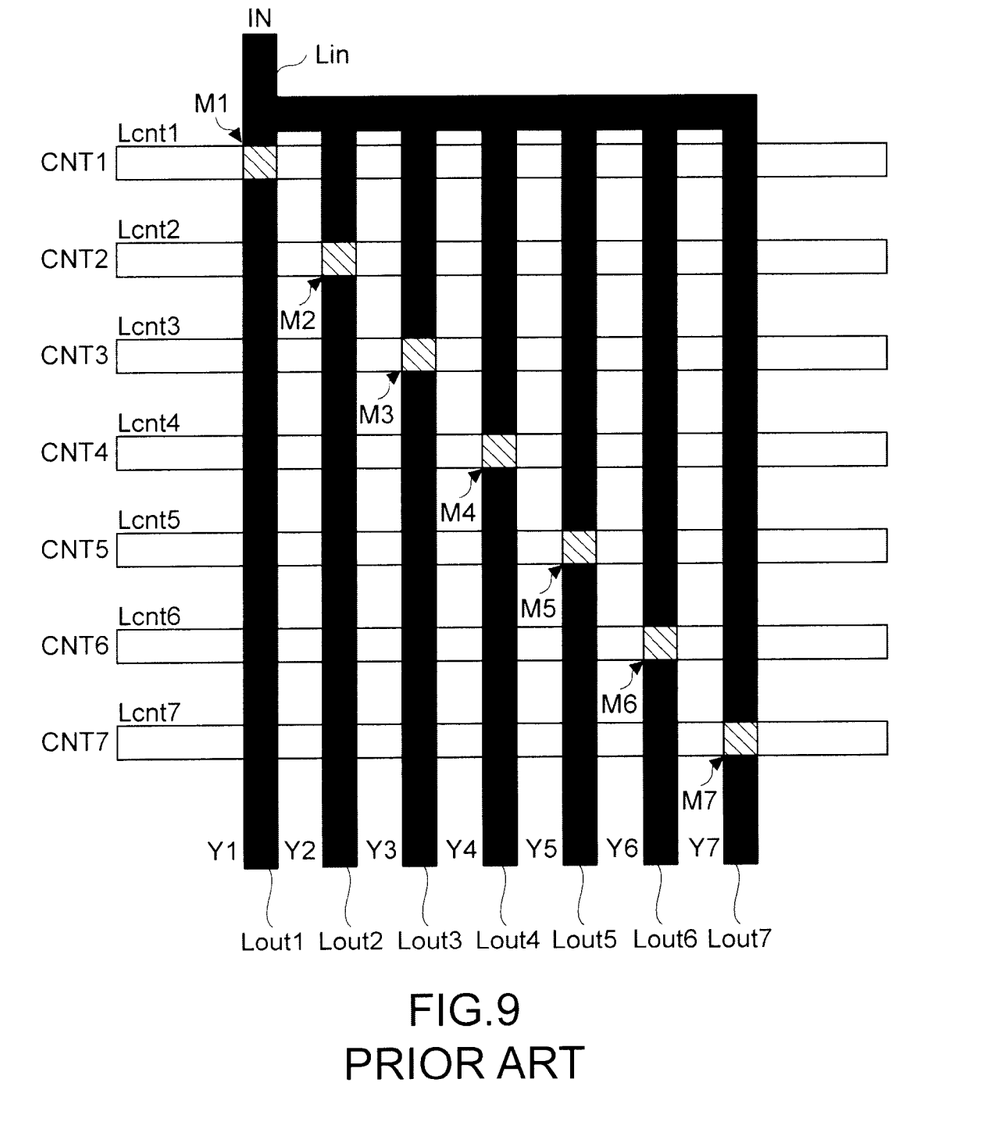
FIG. 9 is a plane view schematically showing a structure of the demultiplexer according to prior art.
Figure 10A:
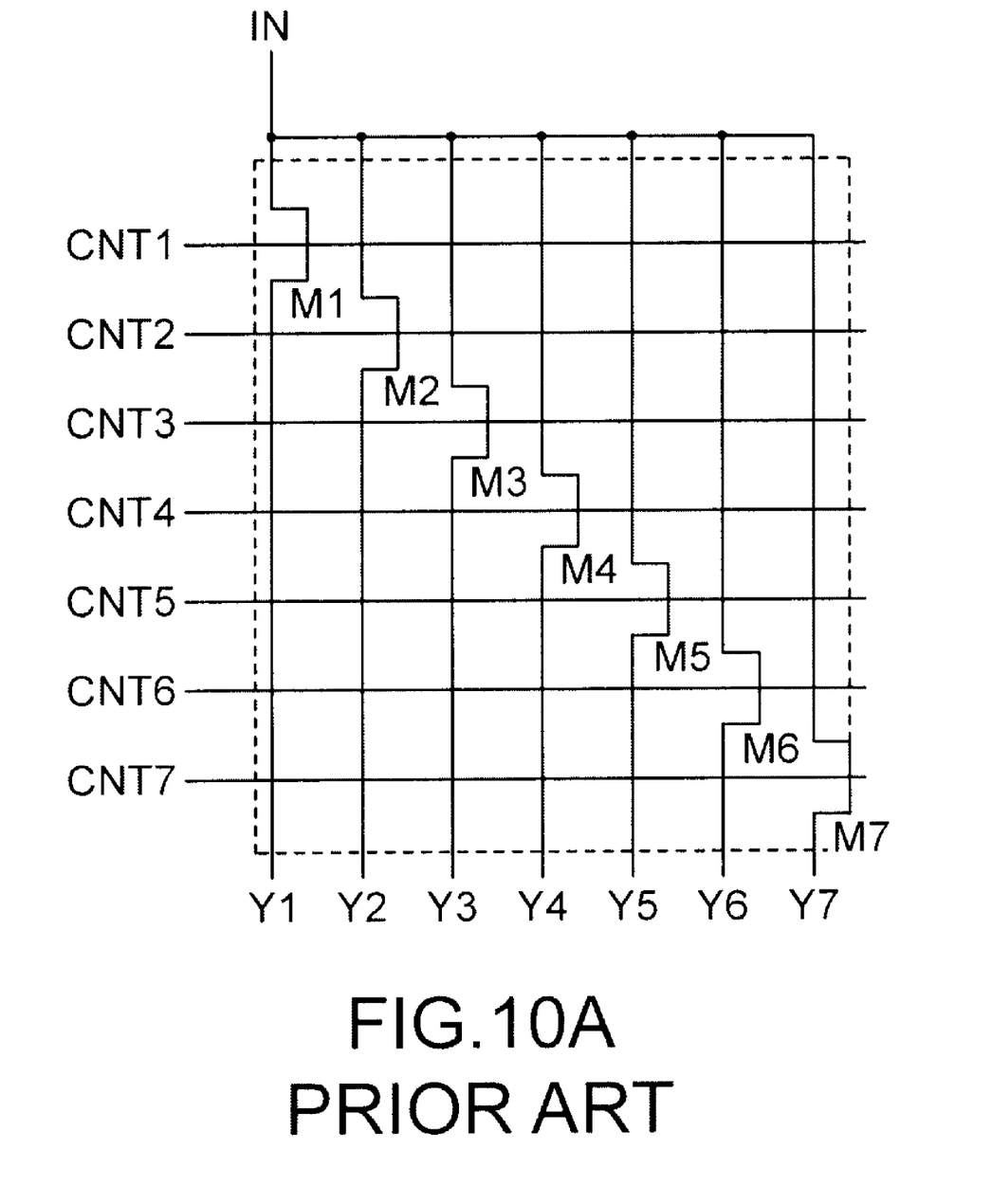
FIG. 10A is a circuit diagram illustrating a demultiplexer of FIG. 9.
Figure 10B:
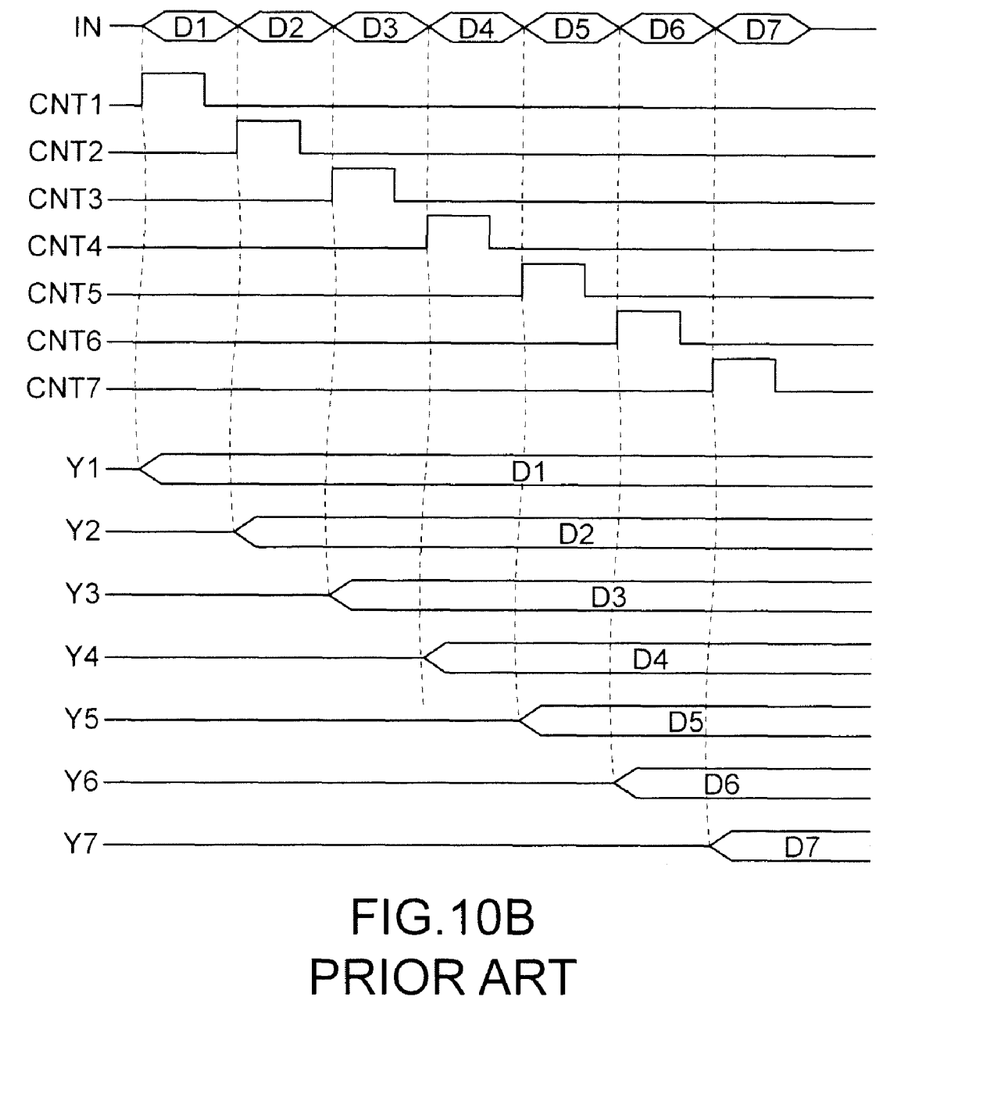
FIG. 10B is a timing diagram of signals associated with the demultiplexer of FIG. 9.

FIG. 9 illustrates a conventional demultiplexer, and FIG. 10 exemplifies operations of the conventional demultiplexer, wherein FIG. 10A is a circuit diagram of the conventional demultiplexer, and FIG. 10B is a timing diagram of the conventional demultiplexer.

In the conventional demultiplexer 10 shown in FIG. 9 and FIG. 10, switching units M1~M7 disposed on output lines Lout1~Lout7 are switched in response to control signals CNT1~CNT7 supplied to control lines Lcnt1~Lcnt7. Accordingly, an input signal IN supplied to an input line Lin is selectively outputted via one of the output lines Lout1~Lout7 as a corresponding one of the output signals Y1~Y7. The switching units M1~M7, for example, are implemented with n-channel field effect transistors.

As shown in FIG. 10B, during a D1 data period of the input signal IN supplied to the input line Lin, the control signal CNT1 is at a high level while the control signals CNT2~CNT7 are at a low level; during a D2 data period of the input signal IN, the control signal CNT2 is at a high level while the control signals CNT1, CNT3~CNT7 are at a low level; during a D3 data period of the input signal IN, the control signal CNT3 is at a high level while the control signals CNT1, CNT2, CNT4~CNT7 are at a low level; during a D4 data period of the input signal IN, the control signal CNT4 is at a high level while the control signals CNT1~CNT3, CNT5~CNT7 are at a low level; during a D5 data period of the input signal IN, the control signal CNT5 is at a high level while the control signals CNT1~CNT4, CNT6, CNT7 are at a low level; during a D6 data period of the input signal IN, the control signal CNT6 is at a high level while the control signals CNT1~CNT5, CNT7 are at a low level; and during a D7 data period of the input signal IN, the control signal CNT7 is at a high level while the control signals CNT1~CNT6 are at a low level. Therefore, the resulting output data with the output signal Y1 is D1; the resulting output data with the output signal Y2 is D2; the resulting output data with the output signal Y3 is D3; the resulting output data with the output signal Y4 is D4; the resulting output data with the output signal Y5 is D5; the resulting output data with the output signal Y6 is D6; and the resulting output data with the output signal Y7 is D7. In other words, the input signal IN is selectively outputted through one of the output lines Lout1~Lout7.

For narrowing the frame of the LCD, it is necessary to limit the sizes of not only the source driver IC but also the layout size of the demultiplexer. The layout lines thus become as thin as a needle.

Furthermore, power saving is also an important issue for designing a display. For example, in the field of mobile phones, the recharging cycle of a battery is one of the issues that concerns an end user very much.

It is critical for a mobile phone to be power-efficient, but it is still necessary to reveal information such as current time, residual power of battery, etc. on the display even when the mobile phone is not working as being put through, navigating pages or checking emails. Therefore, the backlight of the display is turned off temporarily to save power and reflected external light is used for revealing the information. However, even if the mobile phone is operated under such a reflective mode, hundreds of microwatts of power is still consumed for standby recovery, and several to hundreds of watts of power is also consumed for telephonic communication.

In the above-mentioned reflective mode, a displaying method such as a conventional MIP (Memory in Pixel) technology is used to minimize power consumption, wherein the analog source driver IC is suspended for saving power while utilizing a memory circuit in a pixel to hold the displayed frame.

According to the MIP technology, data are stored in a one-bit (two-value) memory of each sub-pixel. By way of selectively combining one of two voltage levels and one of three elementary colors in each pixel, eight colors ($8=2^3$) can be realized. However, a typical source driver IC generally reveals each pixel with combinations selected from 64 voltage levels and 3 elementary colors, which results in about 262K colors ($262,144=64^3$). It is apparent that many colors are sacrificed in the MIP technology.

For solving such a problem, a multi-bit MIP technology is preferred. For example, if the memory in each sub-pixel is of six bits, the performance will be comparable to that of the typical source driver IC, i.e. 262K colors ($262,144=(2^6)^3$) for each pixel. Since a 6-bit memory is used in each sub-pixel but only one source line at a side of the array is provided for writing data to each sub-pixel, time division is required for distributing data to the memories of the sub-pixels with the aid of a demultiplexer. Due to the demand on high resolution, the size of each sub-pixel is limited to at most 100 microns. In other words, the demultiplexer has to be miniaturized to a certain extent.

SUMMARY OF THE INVENTION

Therefore, an object of the present invention is to provide a miniaturized demultiplexer with reduced numbers of terminals and wires.

Another object of the present invention is to provide an electronic device such as a liquid crystal display using a miniaturized demultiplexer.

The present invention relates to a demultiplexer, which includes an input terminal for providing an input signal; a plurality of output terminals for outputting the input signal; and a switching circuit connected between the input terminal and the output terminals for selectively outputting the input signal from the output terminals according to a plurality of control signals provided via corresponding control terminals. The switching circuit includes one or more switching elements serially connected between the input terminal and each of the output terminals, and simultaneously switching elements more than two switching elements thereof coupled to different ones of the output terminals according to a single one of the control signals.

The present invention also relates to a demultiplexer, which includes an input terminal; first to seventh output terminals; and first to twelfth switching elements connected between the input terminal and the first to seventh output terminals, and switched according to first to third control signals. The first to third switching elements are connected between the input terminal and the first output terminal in series; the fourth and fifth switching elements are connected between the input terminal and the second output terminal in series; the sixth and seventh switching elements are connected between the input terminal and the third output terminal in series; the eighth and ninth switching elements are connected between the input terminal and the fourth output terminal in series; the tenth switching elements is connected between the input terminal and the fifth output terminal in series; the eleventh switching elements is connected between the input terminal and the sixth output terminal in series; the twelfth switching elements is connected between the input terminal and the seventh output terminal in series; the first, fourth, eighth and tenth switching elements are switched according to the first control signal; the second, fifth, sixth and eleventh switching elements are switched according to the second control signal; and the third, seventh, ninth and twelfth switching elements are switched according to the third control signal.

The present invention further relates to an electronic device, which includes a demultiplexer according to the present invention and a functional member coupled to the output terminals of the demultiplexer.

The present invention further relates to a liquid crystal display, which includes a demultiplexer according to the present invention and an active matrix display member to be driven by the output signals of the demultiplexer.

BRIEF DESCRIPTION OF THE DRAWINGS

The above contents of the present invention will become more readily apparent to those ordinarily skilled in the art after reviewing the following detailed description and accompanying drawings, in which:

FIG. 4A~FIG. 4K are timing sequence diagrams of signals associated with the demultiplexer of FIG. 1;

DETAILED DESCRIPTION OF THE PREFERRED EMBODIMENT

Figure 1:
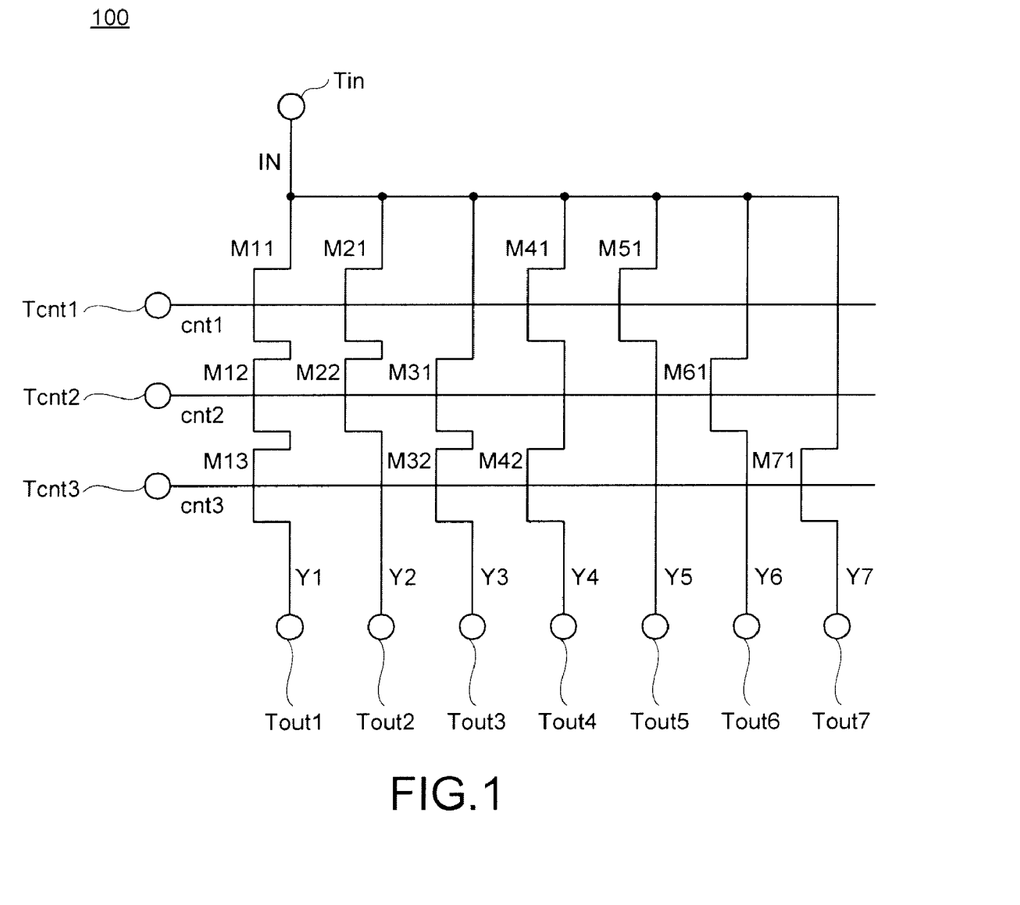
FIG. 1 is a circuit diagram illustrating a demultiplexer according to an embodiment of the present invention.
Figure 2:
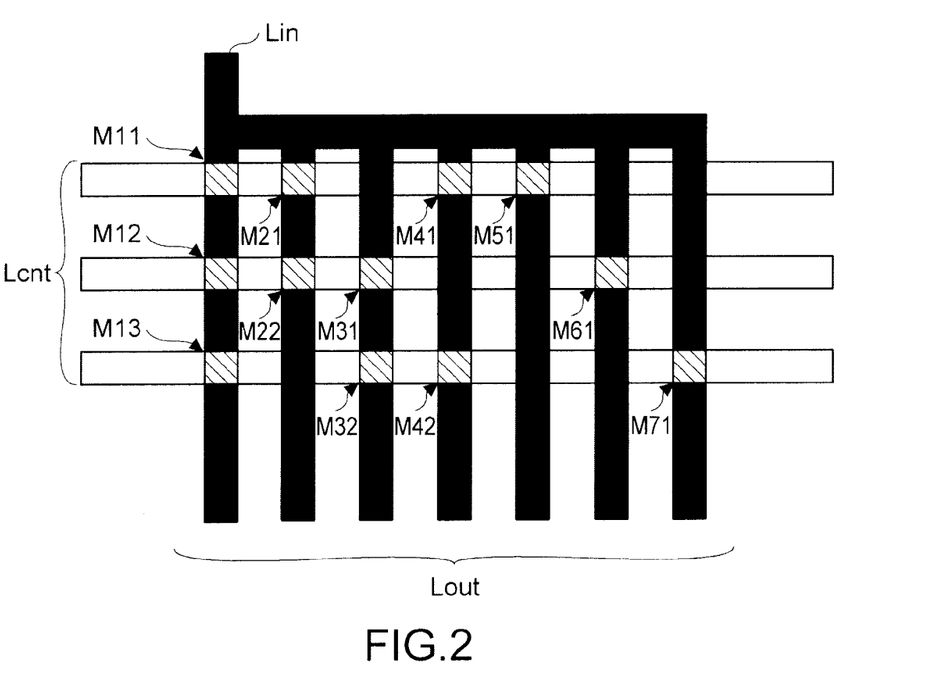
FIG. 2 is a plane view schematically showing a structure of the demultiplexer of FIG. 1.
Figure 3:
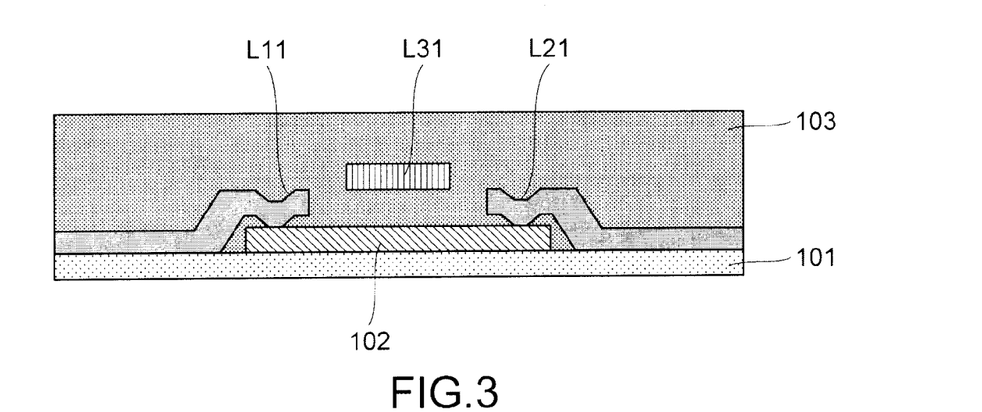
FIG. 3 is a cross-sectional view schematically showing a structure of the demultiplexer of FIG. 1.

Please refer to FIG. 1, FIG. 2 and FIG. 3 for illustrating a demultiplexer according to an embodiment of the present invention.

The demultiplexer 100 has an input terminal Tin and first to seventh output terminals Tout1~Tout7, and includes first to twelfth switching elements M11, M12, M13, M21, M22, M31, M32, M41, M42, M51, M61 and M71 disposed between the input terminal and the output terminals and selectively switched according to first to third control signals cnt1~cnt3 supplied via first to third control terminals Tcnt1~Tcnt3.

The first to twelfth switching elements M11, M12, M13, M21, M22, M31, M32, M41, M42, M51, M61 and M71, for example, can be implemented with n-channel field effect transistors. In the application to an LCD panel as exemplified in FIG. 2 and FIG. 3, the switching elements are formed on an insulating substrate 101 such as glass. A channel layer 102 is formed of p-type semiconductor on the insulating substrate 101. A wire L11 is formed at one end of the channel layer 102 and connected to a wire Lin which is connected to the input terminal Tin. At the other end of the channel layer 102, a wire L21 is formed and connected to wires Lout which are connected to the output terminals Tout1~Tout7. Furthermore, a wire L31 is formed above the channel layer 102 through an oxide film 103. The wire L31 is connected to any of the wires Lcnt which are connected to the control terminals Tcnt1~Tcnt3. The wires L11, L21 and L31, for example, are formed of aluminum or other suitable conductive material.

It is to be noted that the switching elements M11, M12, M13, M21, M22, M31, M32, M41, M42, M51, M61 and M71 are not limited to n-channel field effect transistors, and can also be, for example, p-channel field effect transistors, bipolar transistors, etc.

The first to third switching elements M11, M12 and M13 are connected between the input terminal Tin and the first output terminal Tout1 in series; the fourth and fifth switching elements M21 and M22 are connected between the input terminal Tin and the second output terminal Tout2 in series; the sixth and seventh switching elements M31 and M32 are connected between the input terminal Tin and the third output terminal Tout3 in series; the eighth and ninth switching elements M41 and M42 are connected between the input terminal Tin and the fourth output terminal Tout4 in series; the tenth switching elements M51 is connected between the input terminal Tin and the fifth output terminal Tout5; the eleventh switching element M61 is connected between the input terminal Tin and the sixth output terminal Tout6; and the twelfth switching element M71 is connected between the input terminal Tin and the seventh output terminal Tout7.

The first, fourth, eighth and tenth switching elements M11, M21, M41 and M51 are switched according to the first control signal cnt1 supplied via the first control terminal Tcnt1; the second, fifth, sixth and eleventh switching elements M12, M22, M31 and M61 are switched according to the second control signal cnt2 supplied via the second control terminal Tcnt2; and the third, seventh, ninth and twelfth switching elements M13, M32, M42 and M71 are switched according to the third control signal cnt3 supplied via the third control terminal Tcnt3.

Now refer to FIG. 4A~FIG. 4K which illustrate timing sequences of signals associated with the demultiplexer 100, wherein FIG. 4A illustrates the timing sequence diagram of the input signal supplied via the input terminal Tin; FIG. 4B illustrates the timing sequence diagram of the first control signal cnt1 supplied via the first control terminal Tcnt1; FIG. 4C illustrates the timing sequence diagram of the second control signal cnt2 supplied via the second control terminal Tcnt2; FIG. 4D illustrates the timing sequence diagram of the third control signal cnt3 supplied via the third control terminal Tcnt3; FIG. 4E illustrates the timing sequence diagram of the first output signal Y1 outputted via the first output terminal Tout1; FIG. 4F illustrates the timing sequence diagram of the second output signal Y2 outputted via the second output terminal Tout2; FIG. 4G illustrates the timing sequence diagram of the third output signal Y3 outputted via the third output terminal Tout3; FIG. 4H illustrates the timing sequence diagram of the fourth output signal Y4 outputted via the fourth output terminal Tout4; FIG. 4I illustrates the timing sequence diagram of the fifth output signal Y5 outputted via the fifth output terminal Tout5; FIG. 4J illustrates the timing sequence diagram of the sixth output signal Y1 outputted via the sixth output terminal Tout6; and FIG. 4K illustrates the timing sequence diagram of the seventh output signal Y7 outputted via the seventh output terminal Tout7.

As shown in FIG. 4A, the level of the input signal supplied via the input terminal Tin changes to D1~D7 in sequence every specified period of time Tx. As shown in FIG. 4(B), FIG. 4(C) and FIG. 4(D), the first to third control signals cnt1~cnt3 and the level of the input signal IN switch synchronously. In this embodiment, charge-holding elements, e.g. capacitive elements capable of holding capacitance, are connected to the first to seventh output terminals Tout1~Tout7. Hereinafter, the operation of the demultiplexer 100 is described in time division.

Within the period of time T1, the input signal IN is inputted as the level D1 via the input terminal Tin. Meanwhile, the first to third control signals cnt1~cnt3 are all at high levels, as shown in FIG. 4(B)~FIG. 4(D). Since the first to third control signals cnt1~cnt3 are all at high levels, the first to the twelfth switching elements M11, M12, M13, M21, M22, M31, M32, M41, M42, M51, M61 and M71 are all turned on. Accordingly, the output signals Y1~Y7 outputted via the output terminals Tout1~Tout7 are all at the level D1, as shown in FIG. 4(E)~FIG. 4(K).

Within the period of time T2, the input signal IN is inputted as the level D2 via the input terminal Tin. Meanwhile, the first and second control signals cnt1 and cnt2 are at high levels and the third control signal cnt3 is at a low level, as shown in FIG. 4(B)~FIG. 4(D). Accordingly, the first, second, fourth to sixth, eighth, tenth and eleventh switching elements M11, M12, M21, M22, M31, M41, M51 and M61 are turned on while the third, seventh, ninth and twelfth switching elements M13, M32, M42 and M71 are turned off so that the output terminals Tout1, Tout3, Tout4 and Tout7 are electrically disconnected from the input terminal Tin. Under this circumstance, the output signals Y1, Y3, Y4 and Y7 are kept at the level D1, as shown in FIG. 4(E), FIG. 4(G), FIG. 4(H) and FIG. 4(K), by the charge-holding elements coupled to corresponding output terminals. On the other hand, what is held by the charge-holding elements connected to the second, fifth and sixth output terminals Tout2, Tout5 and Tout6 becomes the level D2, as shown in FIG. 4(F), FIG. 4(I) and FIG. 4(J), since the second, fifth and sixth output terminals Tout2, Tout5 and Tout6 are electrically connected to the input terminal Tin.

Within the period of time T3, the input signal IN is inputted as the level D3 via the input terminal Tin. Meanwhile, the first and second control signals cnt1 and cnt2 are at high levels and the third control signal cnt3 is at a low level, as shown in FIG. 4(B)~FIG. 4(D). Accordingly, the first, fourth, eighth and tenth switching elements M11, M21, M41 and M51 are turned off while the second, third, fifth to seventh, ninth, eleventh and twelfth switching elements M12, M13, M22, M31, M32, M42, M61 and M71 are turned on so that the output terminals Tout1, Tout2, Tout4 and Tout5 are electrically disconnected from the input terminal Tin. Under this circumstance, the output signals Y1 and Y4 outputted from the output terminals Tout1 and Tout4 are kept at the level D1, as shown in FIG. 4(E) and FIG. 4(H), while the output signals Y2 and Y5 outputted from the output terminals Tout2 and Tout5 are kept at the level D2, as shown in FIG. 4(F) and FIG. 4(I). On the other hand, what is held by the charge-holding elements connected to the third, sixth and seventh output terminals Tout3, Tout6 and Tout7 becomes the level D3, as shown in FIG. 4(G), FIG. 4(J) and FIG. 4(K), since the third, sixth and seventh output terminals Tout3, Tout6 and Tout7 are electrically connected to the input terminal Tin.

Within the period of time T4, the input signal IN is inputted as the level D4 via the input terminal Tin. Meanwhile, the first and third control signals cnt1 and cnt3 are at high levels and the second control signal cnt2 is at a low level, as shown in FIG. 4(B)~FIG. 4(D). Accordingly, the second, fifth, sixth and eleventh switching elements M12, M22, M31 and M61 are turned off while the first, third, fourth, seventh to ninth, tenth and twelfth switching elements M11, M13, M21, M32, M41, M42, M51 and M71 are turned on so that the output terminals Tout1, Tout2, Tout3 and Tout6 are electrically disconnected from the input terminal Tin. Under this circumstance, the output signal Y1 outputted from the output terminal Tout1 is kept at the level D1, as shown in FIG. 4(E); the output signal Y2 outputted from the output terminal Tout2 is kept at the level D2, as shown in FIG. 4F; and the output signals Y3 and Y6 outputted from the output terminals Tout2 and Tout6 are kept at the level D3, as shown in FIG. 4(G) and FIG. 4(J). On the other hand, what is held by the charge-holding elements connected to the fourth, fifth and seventh output terminals Tout4, Tout5 and Tout7 becomes the level D4, as shown in FIG. 4H, FIG. 4I and FIG. 4K, since the fourth, fifth and seventh output terminals Tout4, Tout5 and Tout7 are electrically connected to the input terminal Tin.

Within the period of time T5, the input signal IN is inputted as the level D5 via the input terminal Tin. Meanwhile, the first control signal cnt1 is at a high level and the second and third control signals cnt2 and cnt3 are at low levels, as shown in FIG. 4(B)~FIG. 4(D). Accordingly, the first, fourth, eighth and tenth switching elements M11, M21, M41 and M51 are turned off while the second, third, fifth to seventh, ninth, eleventh and twelfth switching elements M12, M13, M22, M31, M32, M42, M61 and M71 are turned on so that the output terminals Tout1~Tout4, Tout6 and Tout7 are electrically disconnected from the input terminal Tin. Under this circumstance, the output signal Y1 outputted from the output terminal Tout1 is kept at the level D1, as shown in FIG. 4(E); the output signal Y2 outputted from the output terminal Tout2 is kept at the level D2, as shown in FIG. 4(F); the output signals Y3 and Y6 outputted from the output terminals Tout3 and Tout6 are kept at the level D3, as shown in FIG. 4(G) and FIG. 4(J); and the output signals Y4 and Y7 outputted from the output terminals Tout4 and Tout7 are kept at the level D4, as shown in FIG. 4(H) and FIG. 4(K). On the other hand, what is held by the charge-holding elements connected to the fifth output terminal Tout5 becomes the level D5, as shown in FIG. 4(I), since the fifth output terminal Tout5 is electrically connected to the input terminal Tin.

Within the period of time T6, the input signal IN is inputted as the level D6 via the input terminal Tin. Meanwhile, the second control signal cnt2 is at a high level and the first and third control signals cnt1 and cnt3 are at low levels, as shown in FIG. 4(B)~FIG. 4(D). Accordingly, the second, fifth, sixth and eleventh switching elements M12, M22, M31 and M61 are turned off while the first, third, fourth, seventh to tenth and twelfth switching elements M11, M13, M21, M32, M41, M42, M51 and M71 are turned on so that the output terminals Tout1~Tout5 and Tout7 are electrically disconnected from the input terminal Tin. Under this circumstance, the output signal Y1 outputted from the output terminal Tout1 is kept at the level D1, as shown in FIG. 4(E); the output signal Y2 outputted from the output terminal Tout2 is kept at the level D2, as shown in FIG. 4(F); the output signal Y3 outputted from the output terminal Tout3 is kept at the level D3, as shown in FIG. 4(G); the output signals Y4 and Y7 outputted from the output terminals Tout4 and Tout7 are kept at the level D4, as shown in FIG. 4(H) and FIG. 4(K); and the output signal Y5 outputted from the output terminal Tout5 is kept at the level D5, as shown in FIG. 4(I). On the other hand, what is held by the charge-holding elements connected to the sixth output terminal Tout6 becomes the level D6, as shown in FIG. 4(J), since the sixth output terminal Tout6 is electrically connected to the input terminal Tin.

Within the period of time T7, the input signal IN is inputted as the level D7 via the input terminal Tin. Meanwhile, the third control signal cnt3 is at a high level and the first and second control signals cnt1 and cnt2 are at low levels, as shown in FIG. 4(B)~FIG. 4(D). Accordingly, the third, seventh, ninth and twelfth switching elements M13, M32, M42 and M71 are turned off while the first, second, fourth to sixth, eighth, tenth and eleventh switching elements M11, M12, M21, M22, M31, M41, M51 and M61 are turned on so that the output terminals Tout1~Tout6 are electrically disconnected from the input terminal Tin. Under this circumstance, the output signal Y1 outputted from the output terminal Tout1 is kept at the level Dl, as shown in FIG. 4(E); the output signal Y2 outputted from the output terminal Tout2 is kept at the level D2, as shown in FIG. 4(F); the output signal Y3 outputted from the output terminal Tout3 is kept at the level D3, as shown in FIG. 4(G); the output signal Y4 outputted from the output terminal Tout4 is kept at the level D4, as shown in FIG. 4(H); the output signal Y5 outputted from the output terminal Tout5 is kept at the level D5, as shown in FIG. 4(I); and the output signal Y6 outputted from the output terminal Tout6 is kept at the level D6, as shown in FIG. 4(J). On the other hand, what is held by the charge-holding elements connected to the seventh output terminal Tout7 becomes the level D7, as shown in FIG. 4(K), since the seventh output terminal Tout7 is electrically connected to the input terminal Tin.

Accordingly, the levels of the input signal are selectively outputted from the output terminals Tout1~Tout7 as the output signals, wherein the level D1 is outputted from the first output terminal Tout1; the level D2 is outputted from the second output terminal Tout2; the level D3 is outputted from the third output terminal Tout3; the level D4 is outputted from the fourth output terminal Tout4; the level D5 is outputted from the fifth output terminal Tout5; the level D6 is outputted from the sixth output terminal Tout6; and the level D7 is outputted from the seventh output terminal Tout7.

According to the above-described embodiment of the present invention, the number of control terminals can be reduced from seven to three and the number of wires can be reduced as well. Thereby, the demultiplexer and associated circuitry can be miniaturized.

In the above-described embodiment of a demultiplexer, the inclusion of one input terminal, three control terminals and seven output terminals is just for exemplification and simplification, and there is no such limitation to the demultiplexers according to the present invention. Preferably, however, a formula $N=2^A-1$ is complied with in general cases, where A is the number of control terminals and N is the number of output terminals.

Figure 5:
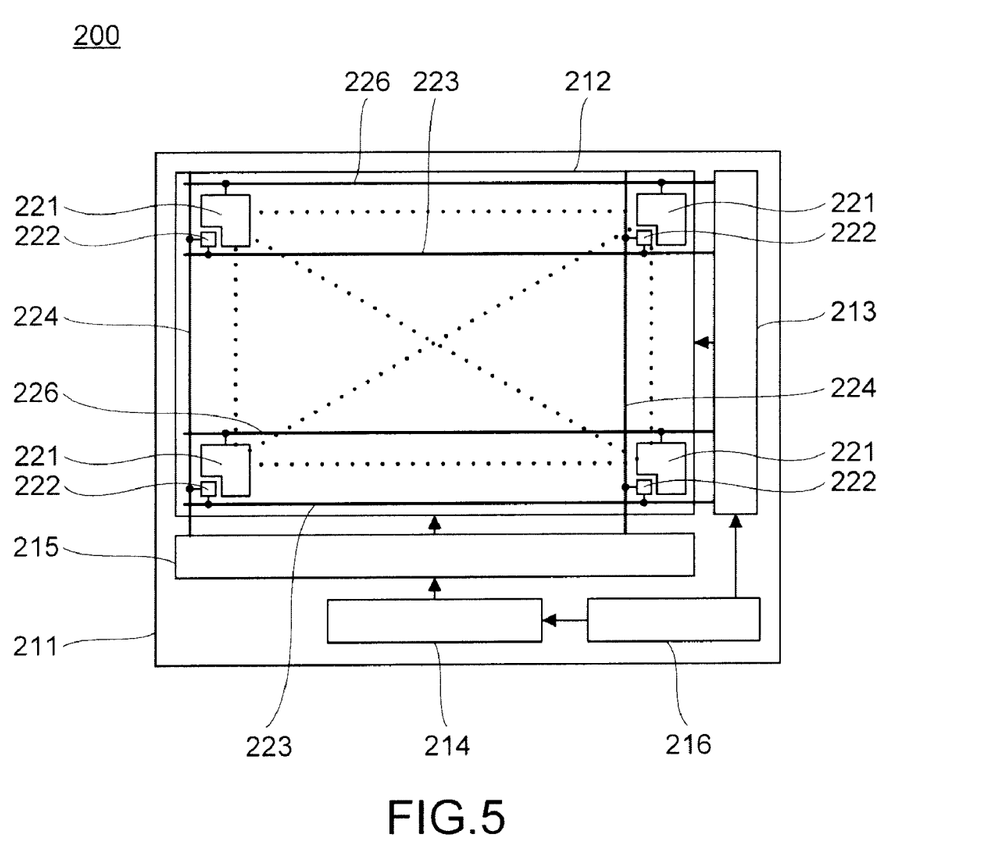
FIG. 5 is a schematic diagram showing components of a LCD according to an embodiment of the present invention.

Hereinafter, the application of a demultiplexer to an active-type LCD according to the present invention is exemplified. FIG. 5 schematically illustrates components of the LCD. The LCD 200 includes a display area 212 disposed on a lower glass substrate 211, and a gate driver IC 213, a source driver IC 214, a demultiplexer 215 and I/O circuit 216 disposed beside the display area 212.

Figure 6:
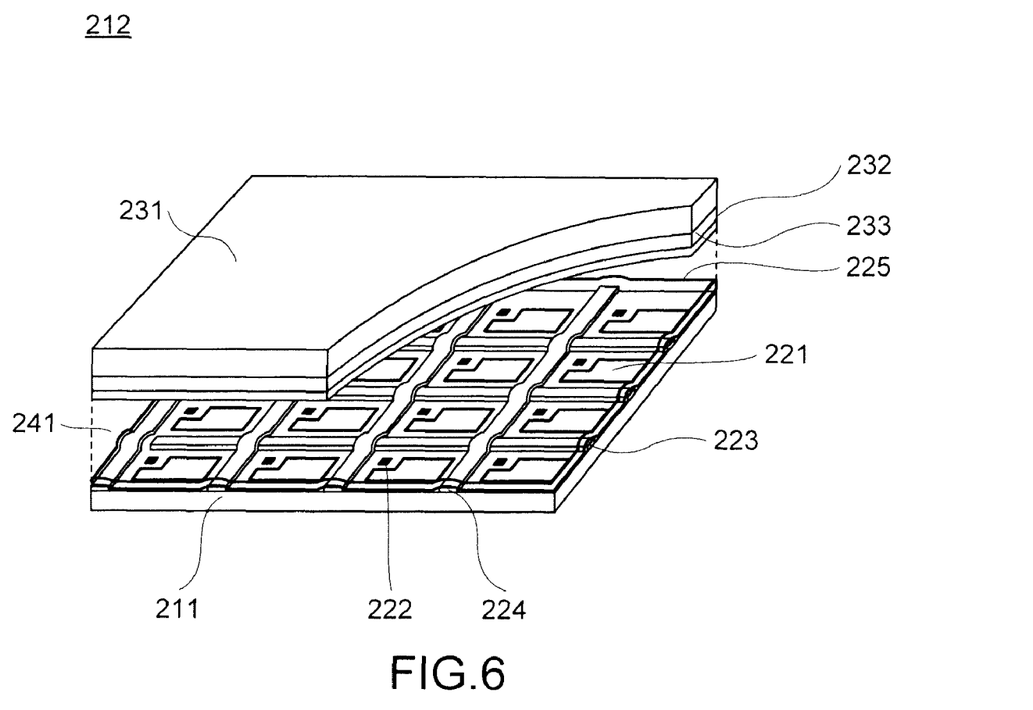
FIG. 6 is a schematic diagram showing a structure of a display zone included in the LCD of FIG. 5.

FIG. 6 schematically shows components of the display area 212. In the display area 212, matrices of pixel electrodes 221, thin film transistors (TFT) 222, gate lines 223 and data lines 224 are formed on the lower glass substrate 211. Above the pixel electrodes 221, thin film transistors (TFTs) 222, gate lines 223 and data lines 224, an alignment film 225 and an upper glass substrate 231 disposed above the alignment film 225 through a spacer layer (not shown) are provided. On almost the entire surface of the upper glass substrate 231 facing to the lower glass substrate 211, a common electrode 232 and an alignment film 233 are formed. Furthermore, a liquid crystal material 241 is sealed in the space between the lower glass substrate 211 and the upper glass substrate 231.

By way of selectively switching the TFTs 222, voltages are supplied to selective pixel electrodes 221 from corresponding data lines 224, and the directions of the liquid crystal molecules vary with the voltage difference between the pixel electrodes 221 and the common electrode 232 so as to change optical properties of the LCD for displaying pixels.

Figure 4:
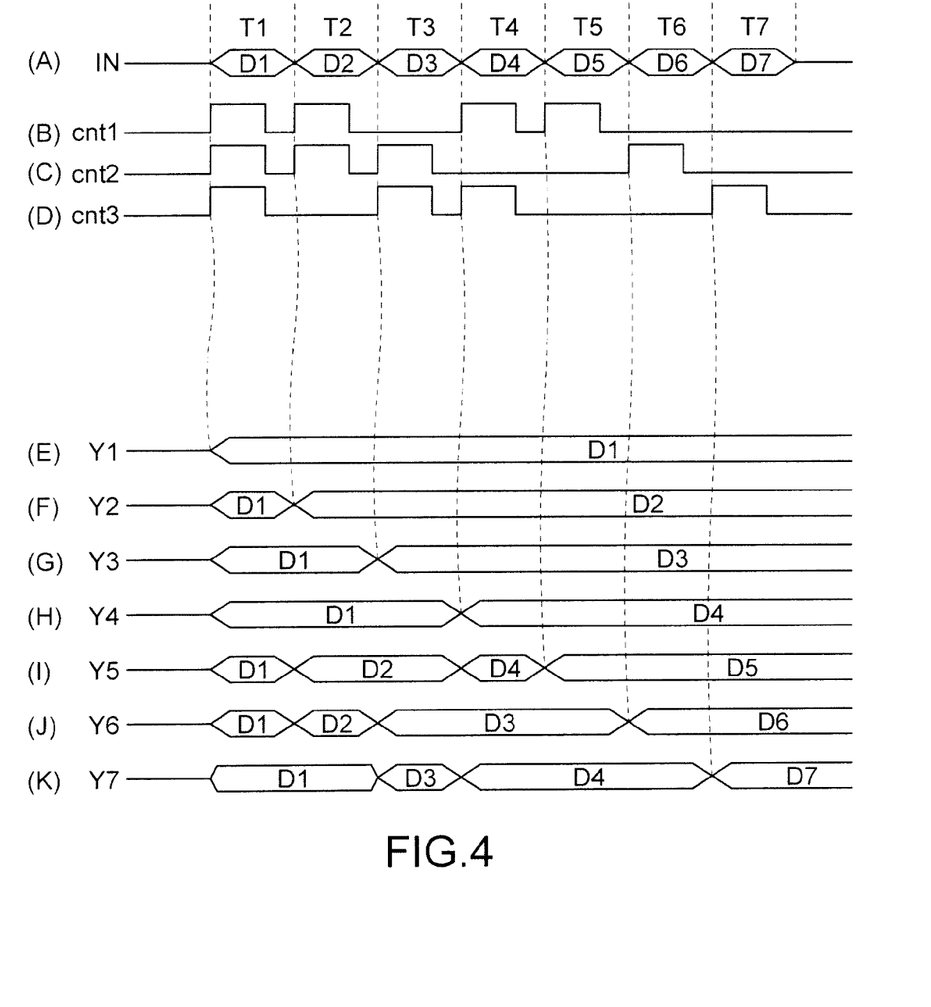

The gate driver IC 213 is coupled to the gates of the TFTs 222 for switching the TFTs 222. The source driver IC 214 supplies driving voltages to sources of the TFTs 222 via the demultiplexer 215 which has a configuration similar to the demultiplexer 100 as shown in FIG. 1~FIG. 3, thereby selectively supplying voltages to the data lines 224 based on the operations of the demultiplexer 215 as illustrated in FIG. 4. Meanwhile, six of the seven outputs of the demultiplexer 100 are used.

Figure 7A:
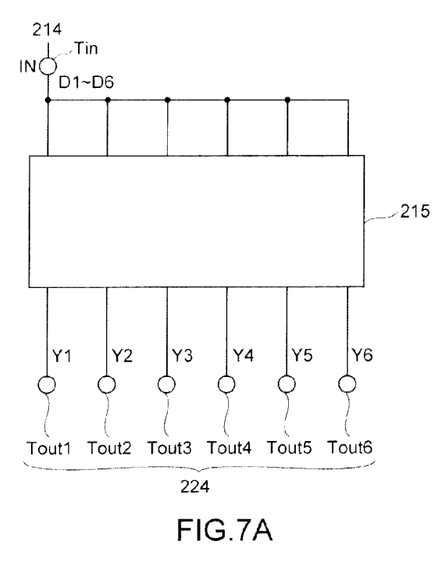
FIG. 7A is an equivalent circuit diagram illustrating an embodiment of a demultiplexer included in the LCD of FIG. 5.
Figure 7B:
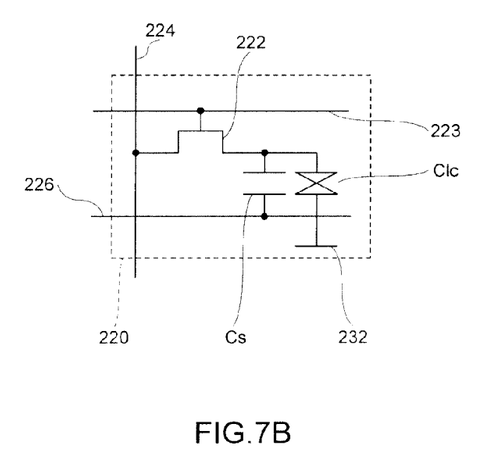
FIG. 7B is an equivalent circuit diagram illustrating an embodiment of a sub-pixel included in the LCD of FIG. 5.

FIG. 7 illustrates equivalent circuits of parts of the LCD 200, wherein FIG. 7A illustrates the demultiplexer 215 beside the display zone 212, and FIG. 7B illustrates a sub-pixel 220 in the display zone 212.

As shown in FIG. 7A, the output of the source driver IC 214 is supplied to the input terminal Tin of the demultiplexer 215. The output terminals Tout1~Tout6 of the demultiplexer 215 are coupled to the data lines 224 and then led to the display area 212. On the other hand, the output of the gate driver IC 213 is led to the display area 212 via gate lines 223.

As shown in FIG. 7B, the gate line 223 led to the display area 212 is connected to the gate of the TFT 222 disposed in the sub-pixel 220; the data line 224 led to the display area 212 is coupled to the source of the TFT 222 disposed in the sub-pixels 220; and the drain of the TFT 222 is coupled to the pixel electrode 221 and to an auxiliary capacitor line 226 via an auxiliary capacitor Cs. Furthermore, FIG. 7B shows that a liquid crystal capacitor Clc is formed in each sub-pixel 220 by clamping liquid crystal molecules 241 between the pixel electrode 221 and the common electrode 232.

By using six of the seven outputs of the demultiplexer 100 of FIG. 1 in the demultiplexer 215 of the LCD 200, the number of control terminals can be reduced to miniaturize the demultiplexer and thus narrow the frame of the LCD 200.

Figure 8:
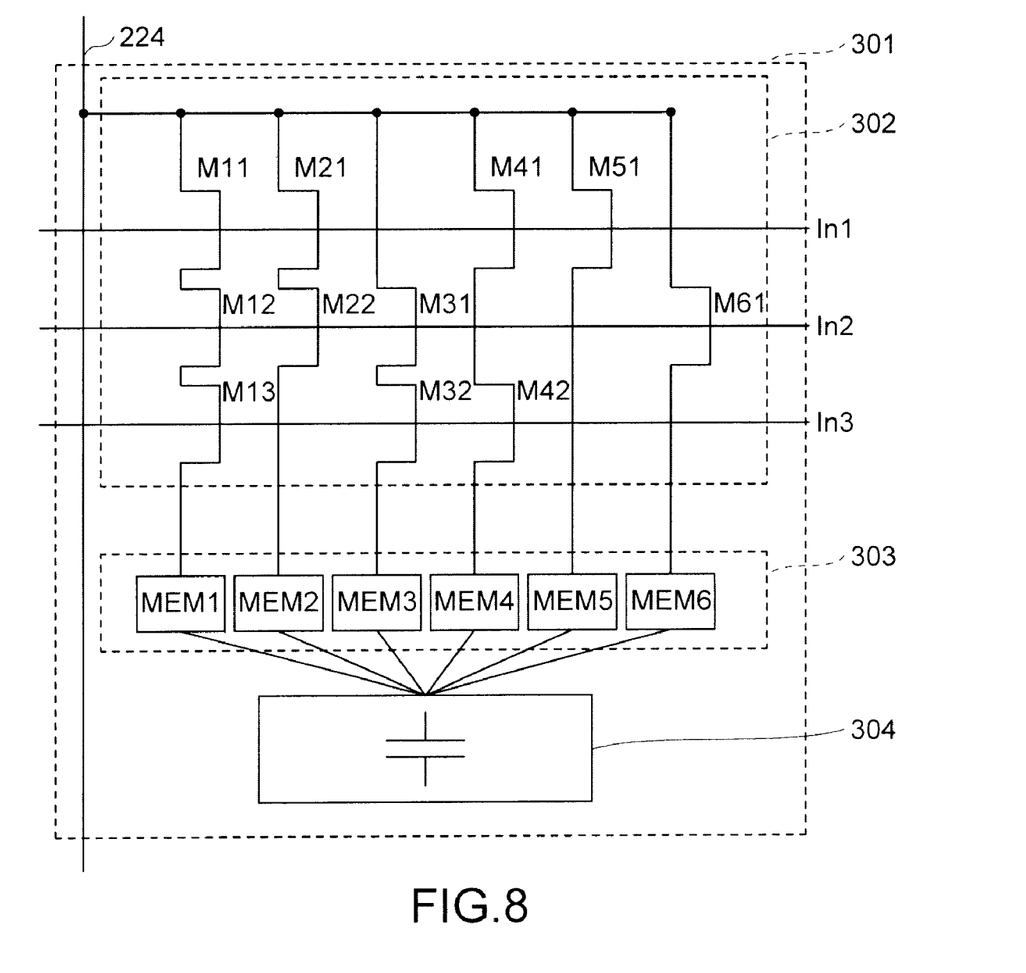
FIG. 8 is a circuit diagram illustrating an embodiment of a demultiplexer included in a sub-pixel with a MIP structure according to the present invention.

The demultiplexer according to the present invention is applicable to the MIP technology. FIG. 8 illustrates an example of the application, wherein a sub-pixel 301 with a MIP structure includes a demultiplexer 302, a memory unit 303, and a sub-pixel capacitor 304.

The demultiplexer 302 has a configuration similar to that of the demultiplexer 100 described above, and utilizes three control lines In1~In3 and six of the seven outputs to store data in the memory unit 303 consisting of six storage elements MEM1~MEM6. Then the sub-pixel capacitor 304 is charged/discharged for displaying according to the 6-bit data stored in memory unit 303.

From the above descriptions, it is understood that the use of the demultiplexer according to the present invention in the sub-pixel results in a reduced number of control lines for dealing with multi-bit data. Therefore, the area occupied by the demultiplexer in the sub-pixel is reduced so as to reduce the area of the sub-pixel. Meanwhile, the imaging effect of the LCD can be enhanced.

It is to be noted that the application of the demultiplexer according to the present invention is not limited to LCD. Instead, it can be used in any other suitable electronic device, e.g. a plasma display, EL display, a mobile phone, a digital camera, a personal digital assistant (PDA), a notebook computer, a desktop computer, a TV set, a global positioning system (GPS), a vehicular display, an aircraft display, a digital frame or a portable DVD player, with or without modification. The output terminals of the demultiplexer in the electronic device may be coupled to a functional member, e.g. a memory cell, an image sensor, a digital-to-analog converter or a display unit.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A demultiplexer, comprising:
an input terminal for receiving an input signal;
a plurality of output terminals for outputting the input signal; and
a switching circuit connected between the input terminal and the output terminals, and including a plurality of switching elements configured to simultaneously output the input signal from a variable number of the output terminals according to a plurality of control signals provided via corresponding control terminals;
wherein at least two of the switching elements are serially connected between the input terminal and at least one of the output terminals, and more than two of the switching elements which are coupled to different ones of the output terminals are simultaneously switchable according to the same one of the control signals.

2. The demultiplexer according to claim 1, wherein the formula $N=2^A-1$ is complied with where A is a number of the control terminals and N is the number of the output terminals.

3. The demultiplexer according to claim 1, wherein the switching elements included in the switching circuit are thin film transistors.

4. The demultiplexer according to claim 1, being used in an electronic device which includes the demultiplexer and a functional member coupled to the output terminals of the demultiplexer.

5. The demultiplexer according to claim 4, wherein the functional member is selected from a memory cell, an image sensor, a digital-to-analog converter or a display unit.

6. The demultiplexer according to claim 4 wherein the electronic device is selected from a mobile phone, a digital camera, a personal digital assistant (PDA), a notebook computer, a desktop computer, a TV set, a global positioning system (GPS), a vehicular display, an aircraft display, a digital frame or a portable DVD player.

7. The demultiplexer according to claim 1, being used in a liquid crystal display which includes the demultiplexer and an active matrix display member to be driven by the output signals of the demultiplexer.

8. A demultiplexer, comprising:
an input terminal;
first to seventh output terminals; and
first to twelfth switching elements connected between the input terminal and the first to seventh output terminals, and switched according to first to third control signals;
wherein:
the first to third switching elements are connected between the input terminal and the first output terminal in series;
the fourth and fifth switching elements are connected between the input terminal and the second output terminal in series;
the sixth and seventh switching elements are connected between the input terminal and the third output terminal in series;
the eighth and ninth switching elements are connected between the input terminal and the fourth output terminal in series;
the tenth switching element is connected between the input terminal and the fifth output terminal in series;
the eleventh switching element is connected between the input terminal and the sixth output terminal in series;
the twelfth switching element is connected between the input terminal and the seventh output terminal in series;
the first, fourth, eighth and tenth switching elements are switched according to the first control signal;
the second, fifth, sixth and eleventh switching elements are switched according to the second control signal; and
the third, seventh, ninth and twelfth switching elements are switched according to the third control signal.

9. The demultiplexer according to claim 8, wherein the switching elements are thin film transistors.

10. The demultiplexer according to claim 8, being used in an electronic device which includes the demultiplexer and a functional member coupled to the output terminals of the demultiplexer.

11. The demultiplexer according to claim 10, wherein the functional member is selected from a memory cell, an image sensor, a digital-to-analog converter or a display unit.

12. The demultiplexer according to claim 10, wherein the electronic device is selected from a mobile phone, a digital camera, a personal digital assistant (PDA), a notebook computer, a desktop computer, a TV set, a global positioning system (GPS), a vehicular display, an aircraft display, a digital frame or a portable DVD player.

13. The demultiplexer according to claim 8, being used in a liquid crystal display which includes the demultiplexer and an active matrix display member to be driven by the output signals of the demultiplexer.

14. A demultiplexer, comprising:
- an input terminal for receiving an input signal;
- a plurality of output terminals for outputting the input signal; and
- a switching circuit connected between the input terminal and the output terminals, which is configured to selectively switch the input signal to selected output terminals according to a plurality of control signals from corresponding control terminals,
- wherein the switching circuit includes a plurality of switching elements, at least two of the switching elements being serially connected between the input terminal and at least one of the output terminals for switching the input signal to a corresponding output terminal, and at least two of the switching elements coupled to different ones of the output terminals are simultaneously controlled by a same one of the plurality of control signals to simultaneously switch the input signal to at least two of the output terminals.

15. The demultiplexer of claim 14, wherein the input signal is switched to a selected variable number of output terminals by selectively controlling the switching elements according to a selected number of control signals.

16. The demultiplexer of claim 14, wherein the switching elements are configured in parallel, between the input terminal and the output terminals.

17. The demultiplexer according to claim 14, wherein the formula $N=2^A-1$ is complied with where A is a number of the control terminals and N is the number of the output terminals.

18. A display, comprising:
- a demultiplexer according to claim 14; and
- an active matrix display member driven by output signals from the output terminals of the demultiplexer.

19. An electronic device, comprising:
- a display according to claim 18; and
- a functional member coupled to the output terminals of the demultiplexer.

20. The electronic device according to claim 19, wherein the electronic device is at least one of a mobile phone, a digital camera, a personal digital assistant (PDA), a notebook computer, a desktop computer, a TV set, a global positioning system (GPS), a vehicular display, an aircraft display, a digital frame and a portable DVD player.

* * * * *